United States Patent
Bruckhaus

(10) Patent No.: US 11,994,413 B2
(45) Date of Patent: May 28, 2024

(54) DEVICE FOR EXCITING A RESOLVER, AND RESOLVER ARRANGEMENT

(71) Applicant: Robert Bosch GmbH, Stuttgart (DE)

(72) Inventor: Tim Bruckhaus, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 246 days.

(21) Appl. No.: 17/312,915

(22) PCT Filed: Nov. 6, 2019

(86) PCT No.: PCT/EP2019/080377
§ 371 (c)(1),
(2) Date: Jun. 10, 2021

(87) PCT Pub. No.: WO2020/120035
PCT Pub. Date: Jun. 18, 2020

(65) Prior Publication Data
US 2022/0042827 A1 Feb. 10, 2022

(30) Foreign Application Priority Data

Dec. 10, 2018 (DE) ..................... 10 2018 221 295.3

(51) Int. Cl.
*G01D 5/20* (2006.01)
*G01D 3/08* (2006.01)
*G01R 31/34* (2020.01)

(52) U.S. Cl.
CPC ............. *G01D 5/2086* (2013.01); *G01D 3/08* (2013.01); *G01R 31/346* (2013.01)

(58) Field of Classification Search
CPC ........ G01D 5/204; G01D 5/2086; G01D 3/08; G01R 31/346; H03M 1/485
See application file for complete search history.

(56) References Cited

U.S. PATENT DOCUMENTS

| 4,894,621 A * | 1/1990 | Koenig ................. H03F 3/2171 |
| | | 330/251 |
| 2009/0141525 A1* | 6/2009 | Tsuji ..................... H02M 7/538 |
| | | 363/131 |

(Continued)

FOREIGN PATENT DOCUMENTS

| CN | 103759773 A | 4/2014 |
| CN | 103998899 A | 8/2014 |

(Continued)

OTHER PUBLICATIONS

Translation of International Search Report for Application No. PCT/EP2019/080377 dated Jan. 29, 2020 (2 pages).

(Continued)

*Primary Examiner* — Jermele M Hollington
*Assistant Examiner* — Suresh K Rajaputra
(74) *Attorney, Agent, or Firm* — Michael Best & Friedrich LLP

(57) ABSTRACT

The present invention relates to providing an electrical voltage for exciting an excitation coil of a resolver (2). In this case, the electrical voltage for exciting the excitation coil of the resolver (2) can be generated by means of pulse-width-modulated driving of at least one half-bridge (H1). In this case, the switching elements of the half-bridge (H1) are fully turned on, with the result that losses such as occur during linear operation of semiconductor switches, for example, can be avoided. If appropriate, the voltage (U_e) provided by the half-bridge (H1) can be additionally increased by means of suitable resonant circuits (L1, C1, C3 . . . ).

11 Claims, 3 Drawing Sheets

(56) References Cited

U.S. PATENT DOCUMENTS

| | | | | |
|---|---|---|---|---|
| 2014/0361792 | A1* | 12/2014 | Nakamura | G01D 5/2073 |
| | | | | 324/655 |
| 2019/0109530 | A1* | 4/2019 | Perreault | H02M 1/083 |
| 2019/0245455 | A1* | 8/2019 | Gudino Carrizales | ...... |
| | | | | H02M 3/33507 |
| 2020/0169160 | A1* | 5/2020 | Kikuchi | H02M 3/33571 |

FOREIGN PATENT DOCUMENTS

| | | | | |
|---|---|---|---|---|
| CN | 107478279 | A | 12/2017 | |
| CN | 107659224 | A | 2/2018 | |
| CN | 108061582 | A | 5/2018 | |
| DE | 102009005494 | A1 | 7/2010 | |
| DE | 202015103071 | U1 | 9/2015 | |
| EP | 2295309 | A2 | 3/2011 | |
| EP | 3223427 | A1 * | 9/2017 | H03F 3/185 |
| EP | 3223427 | A1 | 9/2017 | |
| JP | 2017173013 | A | 9/2017 | |

OTHER PUBLICATIONS

Broadcom, "ACPL-P346/ACPL-W346," Data Sheet, Jun. 7, 2018, pp. 1-20.

\* cited by examiner

DEVICE FOR EXCITING A RESOLVER, AND RESOLVER ARRANGEMENT

BACKGROUND OF THE INVENTION

The present invention relates to a device for exciting a resolver and to a resolver arrangement having such a device.

Resolvers are used in numerous areas of application for detecting an angular position of actuated or unactuated rotary joints, motors or the like. Control of a resolver generally requires an excitation signal. The excitation signal can be for example a sinusoidal voltage signal having a suitable amplitude and frequency. In order to provide the excitation signal at an adequate driver power, an amplifier circuit for voltage amplification is generally employed in combination with a push-pull output stage for current amplification.

A device and a method for determining an angular position by means of a resolver are known from the document DE 10 2009 005 494 A1, for example. In this instance, a field winding of a resolver is excited using a reference signal, and resultant signals from two further windings of the resolver are sampled and evaluated by means of Fourier coefficients.

SUMMARY OF THE INVENTION

Accordingly, there is provision for:

A device for exciting a resolver, having a first output connection, a second output connection, a first half-bridge and a control apparatus. The first output connection is designed to be coupled to a first excitation connection of the resolver, and the second output connection is designed to be coupled to a second excitation connection of the resolver. The first half-bridge comprises a first switching element and a second switching element. The first switching element is arranged between a supply voltage and a first node. The second switching element is arranged between the first node and a reference-ground potential. The first node is electrically coupled to the first output connection of the device for exciting the resolver. The control apparatus is designed to control the first switching element and the second switching element.

Additionally, there is provision for:

A resolver arrangement having a resolver and a device according to the invention for exciting the resolver. The resolver comprises a field winding having a first excitation connection and a second excitation connection.

SUMMARY OF THE INVENTION

The present invention is based on the insight that conventional excitation of a field coil for a resolver generally requires power amplification of an excitation signal. For this power amplification, conventional control preferably involves employing current amplification using a push-pull output stage. The transistors of such a push-pull output stage operate at least intermittently in a so-called linear mode and therefore cause a high level of power loss. This high power loss needs to be dissipated as thermal energy. Furthermore, such a push-pull output stage requires a relatively high input voltage in comparison with the output voltage. The input voltage generally needs to be at least twice as great as the desired signal amplitude at the output.

The present invention is therefore based on the idea of taking account of this insight and providing for improved control of the field coil of a resolver. In particular, the electrical losses during provision of the excitation voltage for the resolver are intended to be kept as low as possible. Furthermore, an available supply voltage is preferably intended to be able to be used as efficiently as possible.

To this end, there is provision according to the invention for the voltage for the field coil of a resolver to be produced by using at least one half-bridge. The individual switching elements in the half-bridges are preferably fully turned on in this instance. The switching elements are therefore not in a high-loss linear mode, in contrast to a push-pull output stage. Instead, a desired output voltage of a half-bridge is produced by means of pulse width modulation (PWM).

According to one embodiment, the device comprises a second half-bridge. The second half-bridge comprises a third switching element, which is arranged between the supply voltage and a second node, and a fourth switching element, which is arranged between the second node and the reference-ground potential. The second node is coupled to the second output connection. The control apparatus is designed to control the first switching element, the second switching element, the third switching element and the fourth switching element. Accordingly, there is provision for a separate half-bridge in each case both for the first output connection and for the second output connection.

The two switching elements of a half-bridge are controlled in complementary fashion with respect to one another in each case. Therefore, either only the switching element for the positive supply voltage or the switching element for the negative voltage, or the reference-ground potential, is closed. If necessary, to prevent a short, there can also be provision for a delay in which both switching elements of a half-bridge are open before one of the two switching elements is closed. Additionally, the switching elements of the second half-bridge can be controlled in complementary fashion with respect to the switching elements of the first half-bridge. For example the switching element of the first half-bridge between the positive supply voltage and the output is therefore closed when the switching element in the second half-bridge between the negative voltage, or the reference-ground potential, and the output is closed. Analogously, the switching element in the first half-bridge between the reference-ground potential and the output voltage is closed when the switching element in the second half-bridge between the positive supply voltage and the output is closed. If necessary, different switching strategies can also be used, however, depending on the application.

The switching elements of the first half-bridge and of the second half-bridge can be for example semiconductor switching elements, such as for example MOSFETs or the like.

Furthermore, any other switching elements, in particular any other semiconductor switching elements, are also possible, of course. The use of half-bridges, in which the switching elements are fully turned on in each case, allows the full scope of voltage between the positive supply voltage and the negative supply voltage, or reference-ground potential, to be used. In this way, it is possible to generate the excitation voltage for the resolver in a particularly efficient and low-loss fashion. In particular, it is possible to avoid high electrical losses, such as occur for example in the case of push-pull output stages for exciting resolvers according to the prior art.

The control apparatus for generating the control signals for the switching elements of the first and second half-bridges can be any suitable control apparatus. By way of example, the control apparatus can be realized by means of a microcontroller or microprocessor. If necessary, there is provision between the outputs of the microcontroller and the control connections of the semiconductor switches for suitable driver stages for the semiconductor switching elements.

According to one embodiment, the first output connection is designed to be coupled to a first excitation connection of a resolver. The second output connection is designed to be coupled to a second excitation connection of a resolver. In this way, the apparatus for exciting the resolver can be electrically coupled to the field coil of a resolver, in order to excite the field coil of the resolver using a predetermined voltage, in particular a voltage having a predefined amplitude and/or a predefined frequency.

According to one embodiment, the control apparatus is designed to provide a pulse-width-modulated control signal at each of the control inputs of the first, second, third and fourth switching elements. Pulse-width-modulated control of the switching elements allows the individual switching elements to be fully controlled, that is to say turned on. In this way, the switching elements are not operated in a high-loss linear mode. The frequency of the pulse-width-modulated control is significantly higher than the fundamental frequency of the voltage signal that is intended to be provided on the field coil of the resolver. By way of example, the frequency of the pulse-width-modulated control can be ten times, or possibly more, the fundamental frequency of the voltage signal that is intended to be provided on the field winding.

According to one embodiment, the control apparatus is designed to detect an output voltage between the first output connection and the second output connection. The first, second, third and fourth switching elements of the first and second half-bridges can be controlled using the detected output voltage in this case. In this way, a closed control loop can be realized. The excitation voltage for the resolver can therefore be set precisely between the first and second output connections and therefore on the field coil of a resolver. In particular, this allows component tolerances and variations, for example on account of thermal movements, to be compensated for in the characteristic quantities of the components.

According to one embodiment, the device for exciting the resolver comprises a first low-pass filter and a second low-pass filter. The first low-pass filter is arranged between the first node of the first half-bridge and the first output connection. The second low-pass filter is arranged between the second node of the second half-bridge and the second output connection. The low-pass filters can be used to filter out or at least significantly attenuate the higher-frequency components of the pulse-width-modulated voltage. Furthermore, the low-pass filters can form a resonant circuit that, if excited in the region of the resonant frequency, can bring about a voltage increase in the output signal and hence in the excitation voltage for the resolver. This resonant circuit can in particular also incorporate the inductance of the resolver as well.

According to one embodiment, the first low-pass filter comprises a first inductor and a first capacitor. The second low-pass filter comprises a second inductor and a second capacitor. The first inductor of the first low-pass filter is connected by a first connection to the first node of the first half-bridge. Additionally, the first inductor is electrically coupled by a second connection to the first output connection. The first capacitor of the first low-pass filter is connected by a first connection to the second connection of the first inductor. Additionally, the first capacitor is connected by a second connection to the reference-ground potential. The second inductor of the second low-pass filter is connected by a first connection to the second node of the second half-bridge. Additionally, the second inductor is electrically coupled by a second connection to the second output connection. The second capacitor of the second low-pass filter is connected by a first connection to the second connection of the second inductor. Additionally, the second capacitor is connected by a second connection to the reference-ground potential. Such a configuration allows relatively simple and inexpensive realization of low-pass filters. In particular, this allows higher-frequency components of the pulse-width-modulated control of the half-bridges to be eliminated and/or a voltage increase in the provided signals to be realized.

According to one embodiment, the device for controlling a resolver comprises a first series capacitor and a second series capacitor. The first series capacitor is arranged in the current path between the first node and the first output connection. The second series capacitor is arranged in the current path between the second node and the second output connection. Such an arrangement of series capacitors allows the half-bridges to be DC-isolated from the resolver. This allows protection of the arrangement, in particular the half-bridges. In particular, the series capacitors can be used to protect the components of the half-bridges, such as e.g. the semiconductor switches of the half-bridges, in the event of overload or in the case of a short, and possibly to prevent irreversible damage. Furthermore, the series capacitors can form a resonant circuit in combination with the inductance of the field coil of the resolver. Further, any inductors present in filter elements, for example the aforementioned low-pass filters, can also be incorporated into the resonant circuit as well. This resonant circuit can also be used to increase the voltage of the excitation voltage.

According to one embodiment, the first series capacitor and the second series capacitor are designed to form a series resonant circuit together with a field coil of a resolver, which field coil is connectable between the first output connection and the second output connection. If the capacitances of the two series capacitors are coordinated with the inductance of the field coil of the resolver and together form a series resonant circuit, this allows a voltage increase to be achieved. In this way, the field coil can be excited using a voltage that is higher than the voltage provided between the first and second nodes of the half-bridges. In particular, the voltage for exciting the field coil may be greater than the supply voltages of the device for exciting the resolver.

According to one embodiment, the device for exciting a resolver comprises a first resistor and a second resistor. The first resistor is arranged between the first output connection and a third node. The second resistor is arranged between the second output connection and the third node. Further, the third node can be electrically coupled to a reference-ground potential. Such a configuration of two resistors, in particular two high-value resistors, allows balancing of the voltage between the two output connections with reference to the reference-ground potential to be achieved.

Alternatively, it is also possible for the first resistor to be arranged between the first output connection and a first voltage potential, and for the second resistor to be arranged between the second output connection and a second voltage potential. In particular, one of the two voltage potentials, e.g. the second voltage potential, can be the reference-ground potential.

The above configurations and developments can, insofar as is practical, be combined with one another in any desired way. Further configurations, developments and implementations of the invention also encompass not explicitly mentioned combinations of features of the invention described above or below in relation to the exemplary embodiments. In particular, a person skilled in the art here will also add individual aspects as improvements or supplementations to the respective basic forms of the invention.

BRIEF DESCRIPTION OF THE DRAWINGS

The present invention is explained in greater detail below on the basis of the exemplary embodiments indicated in the schematic figures of the drawings, in which.

DETAILED DESCRIPTION

Figure 1:
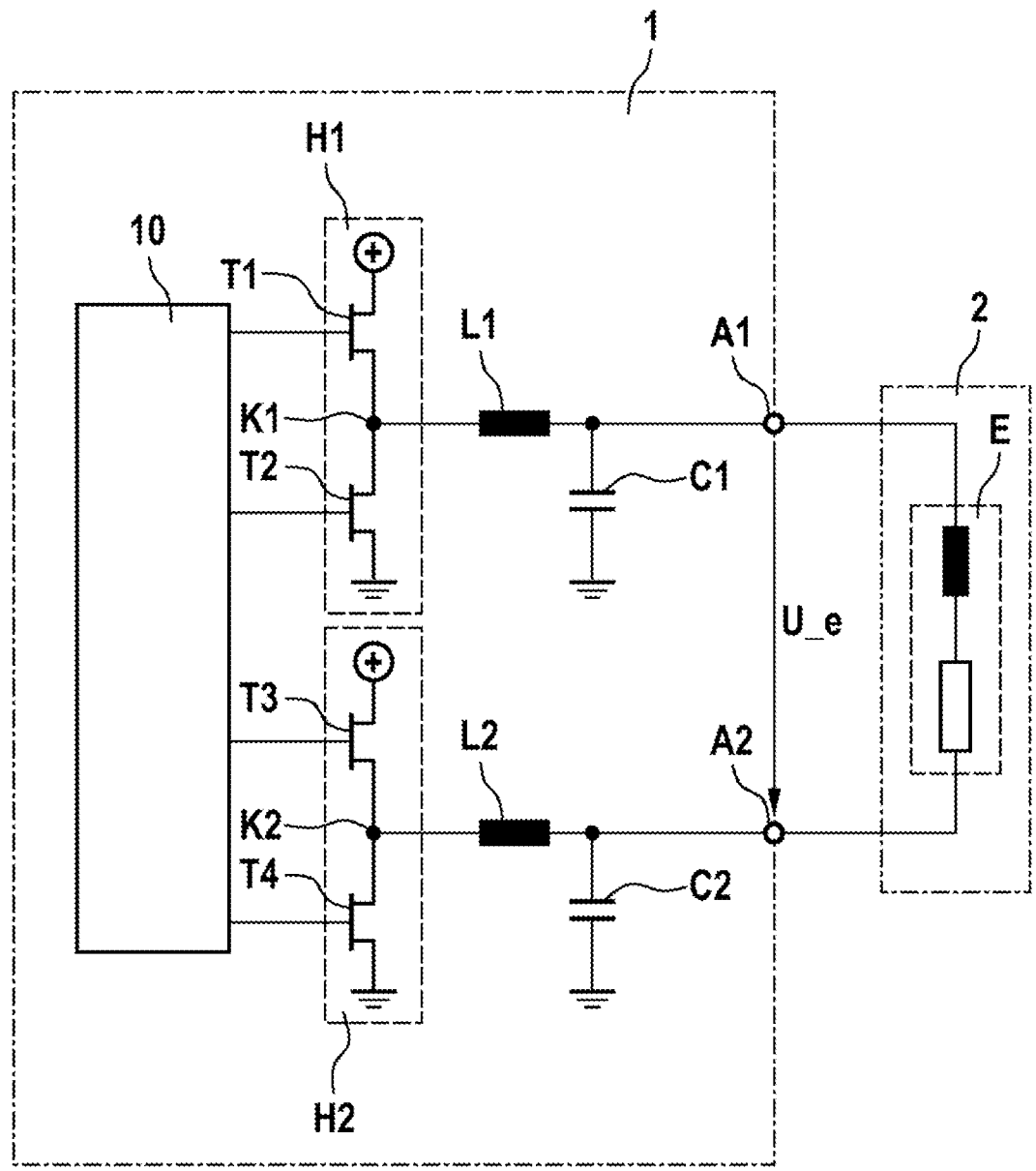
FIG. 1: shows a schematic depiction of a resolver arrangement with a device for exciting a resolver according to one embodiment.

FIG. 1 shows a schematic depiction of a block diagram, as forms the basis for a device 1 for controlling a resolver 2 according to one embodiment. In this embodiment the device 1 for controlling the resolver 2 comprises a control apparatus 10, a first half-bridge H1 and a second half-bridge H2. The first half-bridge H1 comprises a first switching element T1 and a second switching element T2. The first switching element T1 is connected by one connection to a supply voltage. Another connection of the first switching element T1 is connected to a first node K1. The control connection of the first switching element T1 is connected to the control apparatus 10. The second switching element T2 is connected by a first connection to the first node K1. A second connection of the control element T2 is connected to a reference-ground potential. A control connection of the second switching element T2 is connected to the control apparatus 10. Analogously to the first half-bridge H1, the second half-bridge H2 also comprises two switching elements T3 and T4. The third switching element T3 of the second half-bridge H2 is connected by a first connection to a supply voltage. A second connection of the third switching element T3 is connected to a second node K2. A first connection of the fourth switching element T4 is connected to the second node K2. Another connection of the fourth switching element T4 is connected to the reference-ground potential. The control connections of the third and fourth switching elements T3, T4 are likewise connected to the control apparatus 10.

The switching elements T1 to T4 of the first and second half-bridges H1 and H2 can be any switching elements. In particular, semiconductor switching elements, for example MOSFETs or the like, are possible.

The control apparatus 10 generates pulse-width-modulated control signals for the clocked opening and closing of the switching elements T1 to T4.

In a particularly simple embodiment, the first node K1 can be connected directly to a first output connection A1. Analogously, the second node K2 can be connected directly to a second output connection A2. In this way a voltage $U\_e$ can be provided between the first output connection A1 and the second output connection A2. This voltage $U\_e$ can be used to feed a field coil E of a resolver 2.

Between the two half-bridges H1, H2 and the output connections A1, A2 there may additionally be provision for a filter device. The filter device comprises a first low-pass filter, which can be provided between the first node K1 and the first output connection A1. Additionally, the filter device 21 comprises a second low-pass filter, which can be provided between the second node K2 and the second output connection A2. The first low-pass filter can comprise a first inductor L1 and a first capacitor C1. The first inductor L1 can be provided between the first node K1 and the first output connection A1. The first capacitor C1 can be provided between the reference-ground potential and the connection of the first inductor L1, which faces the first output connection A1. Analogously, there can be provision for a second inductor L2 between the second node K2 and the second output connection A2, and a second capacitor C2 can be provided between a reference-ground potential and the connection of the second inductor L2, which faces the second output connection A2. In this way, the two low-pass filters can be used to filter out or at least reduce higher-frequency components of the voltage signals provided at the nodes K1 and K2. Furthermore, the low-pass filter arrangements described above can form resonant circuits in each case. If these resonant circuits are excited in the region of the resonant frequency, this allows a voltage increase in the voltages provided at the nodes K1 and K2. In this way, it is basically possible to provide the output connections A1 and A2 with a voltage that may even be higher than the supply voltage that feeds the half-bridges H1 and H2.

To produce the excitation voltage $U\_e$ for a field coil E of a resolver 2, the first, second, third and fourth switching elements T1 to T4 are controlled by the control apparatus 10 in a suitable manner. In particular, pulse-width-modulated control of the four switching elements T1 to T4 is effected in this instance. This control involves the controlled switching elements being fully turned on, that is to say closed, in each case. In the uncontrolled state, the applicable switching elements are fully open. There is therefore no linear mode effected for the switching elements, in which the switching elements are only partly on in each case.

The control apparatus 10 controls the two switching elements T1 to T4 of the half-bridges H1 and H2 in complementary fashion in each case. That is to say that either the upper switching element T1 or T3, which is connected to the supply voltage, is on or alternatively the lower switching element T2, T4, which is connected to the reference-ground potential, is on. If necessary, a change of control can involve provision in each case for a predefined delay in which both the upper (T1, T3) and lower (T2, T4) switching elements are open at the same time. This makes it possible to ensure that a short between the supply voltage and the reference-ground potential is avoided during the switching process. The carrier frequency of the pulse-width-modulated control of the switching elements T1 to T4 is significantly greater in this case than a fundamental frequency of the excitation signal $U\_e$ that is intended to be provided on the field coil E of the resolver 2. By way of example, the pulse-width-modulated control can be effected at a clock rate of ten times the fundamental frequency or more.

Figure 2:
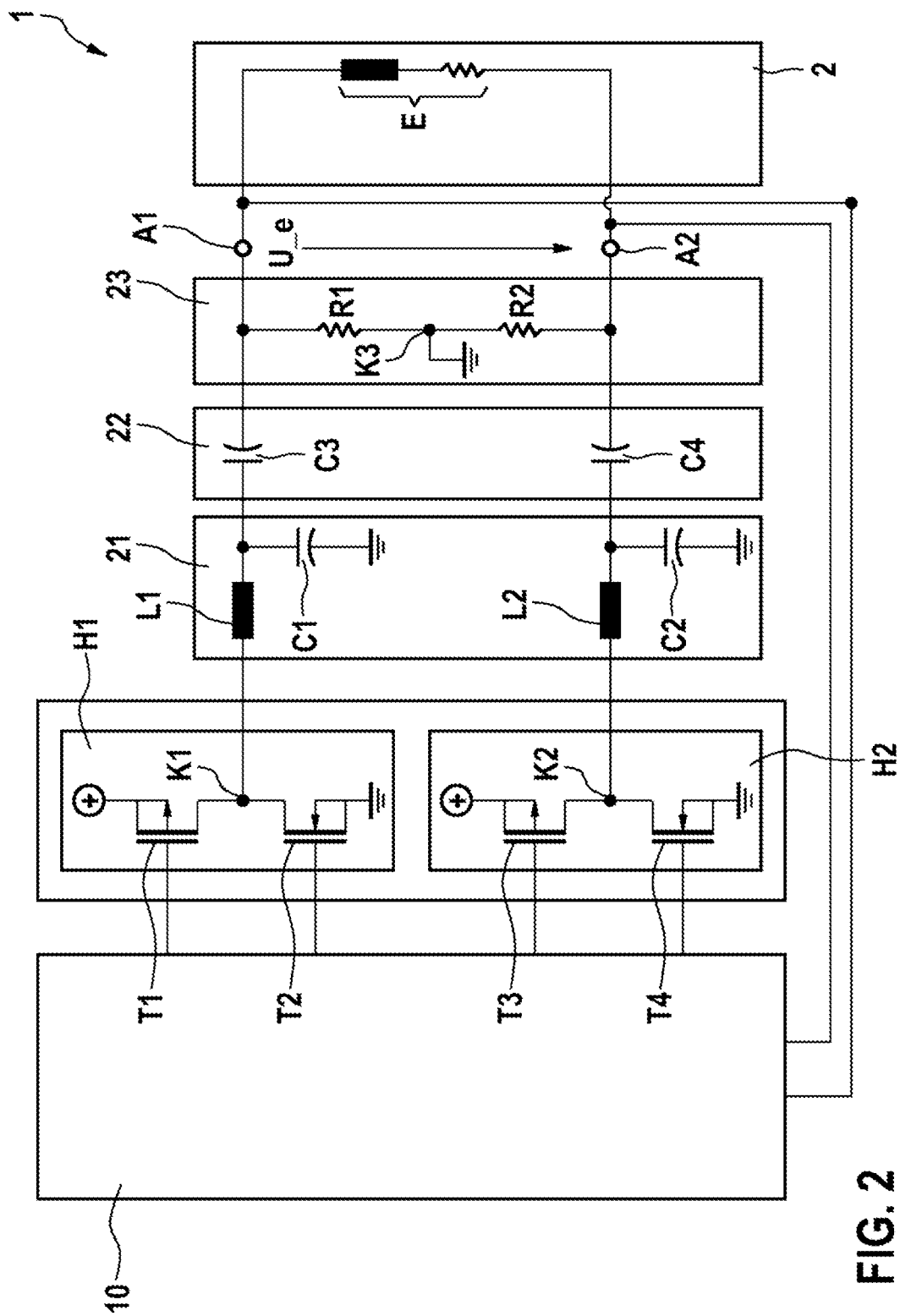
FIG. 2: shows a schematic depiction of a block diagram of a resolver arrangement with a device for exciting a resolver according to another embodiment.

FIG. 2 shows a block diagram of a resolver arrangement with a device 1 for controlling a resolver 2 according to another embodiment. All the explanations already provided in connection with FIG. 1 apply to this embodiment. FIG. 2 differs from FIG. 1 in particular in that the arrangement 1 optionally comprises series capacitors 22 and/or a module 23 for setting a DC voltage potential. Furthermore, there can be provision for feedback of the output voltage $U\_e$ at the control apparatus 10.

As can be seen in FIG. 2, there can be provision for a first series capacitor C3 between the first node, in particular between the first low-pass filter, and the first output connection A1. Analogously, there can be provision for a second series capacitor C4 between the second node K2, in particular between the second low-pass filter, and the second output connection A2. This allows the two series capacitors C3 and C4 to be used to electrically decouple the output connections A1 and A2 with the field coil E connected thereto from the two half-bridges H1 and H2. Furthermore, the two series capacitors C3 and C4 can form a resonant circuit together with the inductance of the field coil E of the resolver 2. This resonant circuit can comprise not only the capacitances of the series capacitors C1, C2 and the resolver inductance but also further components, such as for example the inductors L1, L2 of the low-pass filters. The resonant frequency of this resonant circuit can, in particular, be coordinated with the fundamental frequency of the excitation voltage U_e. This allows the resonant circuit operated at resonance or the resonant circuit operated close to the resonant point to be used to achieve an increase in the output voltage U_e.

Depending on the application, instead of the inductors L1, L2, resistors or other suitable electrical components can also be employed if necessary.

Furthermore, for example the module 23 can be used to set the DC voltage potential of the output voltage U_e. To this end, there can be provision for a first resistor R1 between the first output connection A1 and a third node K3. Additionally, there can be provision for a second resistor R2 between the second output connection A2 and the third node K3. If necessary, the third node K3 can be connected to a reference-ground potential or a predefined voltage potential.

Alternatively, it is also possible for the first resistor R1 and the second resistor R2 not to be connected to one another at a common third node K3. By way of example, the first resistor R1 can be arranged between the first output connection A1 and a first voltage potential, and the second resistor R2 can be arranged between the second output connection A2 and a second voltage potential. In this case, one of the two voltage potentials can be a reference-ground potential, for example.

The first resistor R1 and the second resistor R2 can, in particular, be relatively high-value resistors in the range of kiloohms or possibly megaohms.

For a closed control loop, the output voltage U_e provided between the first output connection A1 and the second output connection A2 can be provided on the control apparatus 10 directly or by way of any suitable detection circuit. In this way, the control apparatus 10 can adapt the pulse-width-modulated control of the switching elements T1 to T4 of the first and second half-bridges by using the detected output voltage U_e. This allows very precise setting of the output voltage U_e. In particular, this also allows component tolerances of the components of the device 1 and variations in the characteristic quantities of the field coil E of the resolver 2 to be compensated for. Further, it is also possible to take into consideration and compensate for fluctuations in the characteristic quantities of the components, for example on account of heating or cooling processes, ageing effects or the like.

The control apparatus 10 can be any control apparatus that is suitable for providing control signals for pulse-width-modulated control of the switching elements T1 to T4 of the first and second half-bridges H1, H2. If necessary, the control signals provided by the control apparatus 10 can be amplified (not depicted) by means of suitable driver stages in order to provide the appropriate power for controlling the switching elements T1 to T4. The control apparatus 10 can be realized by means of an appropriately configured or programmed microcontroller or the like, for example.

Figure 3:
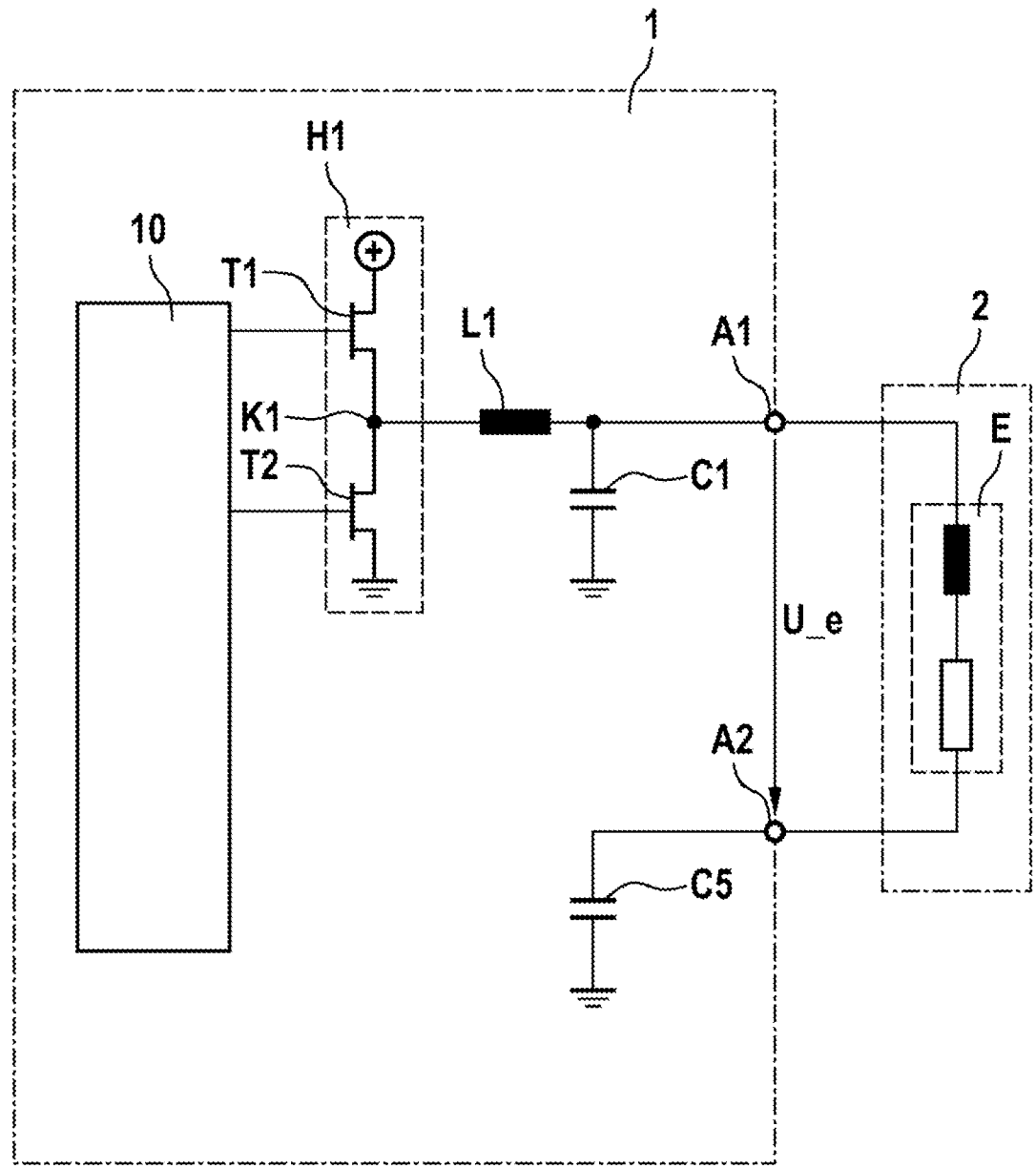
FIG. 3: shows a schematic depiction of a block diagram of a resolver arrangement with a device for exciting a resolver according to yet another embodiment.

In another embodiment, one of the two half-bridges H1 or H2 can be dispensed with, for example. FIG. 3 shows a block diagram of a resolver arrangement with a device 1 for exciting a resolver 2 according to an embodiment with only one half-bridge H1. Furthermore, all the explanations previously provided in connection with FIG. 1 or FIG. 2 also apply to the device 1 according to FIG. 3, however. In particular, there can be provision for a low-pass filter, for example comprising the inductor L1 and the capacitor C2, between the first node K1 and the first output connection A1. Similarly, there can be provision, for example, for a series capacitor C3 between the first node K1, in particular between the first filter element, on the one hand, and the first output connection A1, on the other.

In the case of a device 1 having only one half-bridge K1, for example the second output connection A2 can be connected to a voltage potential, for example the reference-ground potential, via a capacitor, depicted as capacitor C5 here. In this case, the capacitance of the capacitor C5 can have a relatively large size.

In summary, the present invention relates to the provision of a voltage for exciting a field coil of a resolver. The voltage for exciting the field coil of the resolver is generated by means of pulse-width-modulated control of at least one half-bridge. The switching elements of the half-bridges are fully turned on in this case, which means that losses such as arise in the linear mode of semiconductor switches, for example, can be avoided. If necessary, suitable resonant circuits can be used to additionally increase the voltage provided by the half-bridge(s).

The invention claimed is:

1. A device (1) for exciting a resolver (2):
   a first output connection (A1) configured to be coupled to a first excitation connection of the resolver (2),
   a second output connection (A2) configured to be coupled to a second excitation connection of the resolver (2),
   a first half-bridge (H1) having a first switching element (T1), which is arranged between a supply voltage and a first node (K1), and a second switching element (T2), which is arranged between the first node (K1) and a reference-ground potential, the first node (K1) being coupled to the first output connection (A1),
   a second half-bridge (H2) having a third switching element (T3), which is arranged between the supply voltage and a second node (K2), and a fourth switching element (T4), which is arranged between the second node (K2) and the reference-ground potential, the second node (K2) being coupled to the second output connection (A2), and
   a control apparatus (10) configured to control the first switching element (T1), the second switching element (T2), the third switching element (T3), and the fourth switching element (T4),
   wherein the control apparatus (10) is configured to provide a pulse-width-modulated control signal at each of the control inputs of the switching elements (T1 to T4), and
   wherein a frequency of the pulse-width-modulated control signal is at least ten times more than that of a fundamental frequency of an excitation voltage provided to the resolver (2).

2. The device (1) as claimed in claim 1, having a first low-pass filter, which is arranged between the first node (K1) and the first output connection (A1).

3. The device (1) as claimed in claim 2, wherein the first low-pass filter comprises a first inductor (L1) and a first capacitor (C1), wherein the first inductor (L1) is connected by a first connection to the first node (K1) of the first half-bridge (H1) and is electrically coupled by a second connection to the first output connection (A1), and the first capacitor (C1) is connected by a first connection to the second connection of the first inductor (L1) and is connected by a second connection to the reference-ground potential.

4. The device (1) as claimed in claim 1, wherein the control apparatus (10) is configured to detect an output voltage (U_e) between the first output connection (A1) and the second output connection (A2), and to control the switching elements (T1 to T4) by using the detected output voltage (U_e).

5. The device (1) as claimed in claim 1, having a second low-pass filter, which is arranged between the second node (K2) and the second output connection (A2).

6. The device (1) as claimed in claim 5, wherein the second low-pass filter comprises a second inductor (L2) and a second capacitor (C2), wherein the second inductor (L2) is connected by a first connection to the second node (K2) of the second half-bridge (H2) and is electrically coupled by a second connection to the second output connection (A2), and the second capacitor (C2) is connected by a first connection to the second connection of the second inductor (L2) and is connected by a second connection to the reference-ground potential.

7. The device (1) as claimed in claim 1, having a first series capacitor (C3), which is arranged between the first node (K1) and the first output connection (A1); and having a second series capacitor (C4), which is arranged between the second node (K2) and the second output connection (A2).

8. The device (1) as claimed in claim 7, wherein the first series capacitor (C3) and the second series capacitor (C4) are designed to form a series resonant circuit with a field coil (E) of a resolver (2), which field coil is connectable between the first output connection (A1) and the second output connection (A2).

9. The device (1) as claimed in claim 1, having a first resistor (R1), which is arranged between the first output connection (A1) and a first voltage potential, and having a second resistor (R2), which is arranged between the second output connection (A2) and a fourth voltage potential.

10. The device as claimed in claim 9, wherein the third voltage potential and the fourth voltage potential are the same.

11. A resolver arrangement, having:
  a resolver (2), comprising a field coil (E) having a first excitation connection and a second excitation connection; and
  a device (1) for exciting the resolver (2) including
    a first output connection (A1) configured to be coupled to a first excitation connection of the resolver (2),
    a second output connection (A2) configured to be coupled to a second excitation connection of the resolver (2),
    a first half-bridge (H1) having a first switching element (T1), which is arranged between a supply voltage and a first node (K1), and a second switching element (T2), which is arranged between the first node (K1) and a reference-ground potential, the first node (K1) being coupled to the first output connection (A1),
    a second half-bridge (H2) having a third switching element (T3), which is arranged between the supply voltage and a second node (K2), and a fourth switching element (T4), which is arranged between the second node (K2) and the reference-ground potential, the second node (K2) being coupled to the second output connection (A2), and
    a control apparatus (10) configured to control the first switching element (T1), the second switching element (T2), the third switching element (T3), and the fourth switching element (T4),
  wherein the control apparatus (10) is configured to provide a pulse-width-modulated control signal at each of the control inputs of the switching elements (T1 to T4), and
  wherein a frequency of the pulse-width-modulated control signal is at least ten times than that of a fundamental frequency of an excitation voltage provided to the resolver (2).

* * * * *